United States Patent
Redeker et al.

(10) Patent No.: US 6,991,517 B2
(45) Date of Patent: *Jan. 31, 2006

(54) LINEAR POLISHING SHEET WITH WINDOW

(75) Inventors: Fred C. Redeker, Fremont, CA (US); Manoocher Birang, Los Gatos, CA (US); Shijian Li, San Jose, CA (US); Sasson Somekh, Los Altos Hills, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/814,405

(22) Filed: Mar. 31, 2004

(65) Prior Publication Data

US 2004/0198185 A1 Oct. 7, 2004

Related U.S. Application Data

(63) Continuation of application No. 10/394,599, filed on Mar. 21, 2003, now Pat. No. 6,796,880, which is a continuation of application No. 09/724,846, filed on Nov. 28, 2000, now Pat. No. 6,585,563, which is a continuation of application No. 09/244,816, filed on Feb. 4, 1999, now Pat. No. 6,179,709.

(51) Int. Cl.
  *B24B 1/00* (2006.01)
(52) U.S. Cl. .................... 451/6; 451/41; 451/288; 451/296
(58) Field of Classification Search .............. 451/6, 451/41, 168, 285–289, 296

See application file for complete search history.

(56) References Cited

U.S. PATENT DOCUMENTS

| 3,888,050 A | 6/1975 | Elm |
| 4,676,029 A | 6/1987 | Palmer |
| 5,016,400 A | 5/1991 | Weber |
| 5,081,796 A | 1/1992 | Schultz |
| 5,127,196 A | 7/1992 | Morimoto et al. |
| 5,196,353 A | 3/1993 | Sandhu et al. |
| 5,257,478 A | 11/1993 | Hyde et al. |
| 5,265,378 A | 11/1993 | Rostoker |
| 5,413,941 A | 5/1995 | Koos et al. |
| 5,433,651 A | 7/1995 | Lustig et al. |
| 5,484,323 A | 1/1996 | Smith |
| 5,489,233 A | 2/1996 | Cook et al. |
| 5,558,568 A | 9/1996 | Talieh et al. |
| 5,563,524 A | 10/1996 | Ungar |
| 5,575,707 A | 11/1996 | Talieh et al. |
| 5,593,344 A | 1/1997 | Weldom et al. |
| 5,597,341 A | 1/1997 | Kodera et al. |
| 5,605,760 A | 2/1997 | Roberts |

(Continued)

FOREIGN PATENT DOCUMENTS

EP  0 468 897 A1  1/1992

(Continued)

OTHER PUBLICATIONS

European Search Report for 00300783.2302, dated Apr. 23, 2003 (AMAT/2890.EP).

*Primary Examiner*—George Nguyen
(74) *Attorney, Agent, or Firm*—Patterson & Sheridan

(57) ABSTRACT

A polishing article for chemical mechanical polishing. The polishing article includes a generally elongated polishing sheet with a polishing surface. The polishing article is formed from a material that is substantially opaque, and has a discrete region extending substantially the length of the polishing sheet that is at least semi-transparent.

8 Claims, 4 Drawing Sheets

U.S. PATENT DOCUMENTS

| | | | |
|---|---|---|---|
| 5,609,511 A | 3/1997 | Moriyama et al. | |
| 5,640,242 A | 6/1997 | O'Boyle et al. | |
| 5,643,046 A | 7/1997 | Katakabe et al. | |
| 5,672,091 A | 9/1997 | Takahashi et al. | |
| 5,692,947 A | 12/1997 | Talieh et al. | |
| 5,722,875 A | 3/1998 | Iwashita et al. | |
| 5,722,877 A | 3/1998 | Meyer et al. | |
| 5,747,385 A | 5/1998 | Torii | |
| 5,762,536 A | 6/1998 | Pant et al. | |
| 5,791,969 A | 8/1998 | Lund | |
| 5,800,248 A | 9/1998 | Pant et al. | |
| 5,803,799 A | 9/1998 | Volodarsky et al. | |
| 5,838,447 A | 11/1998 | Hiyama et al. | |
| 5,846,882 A | 12/1998 | Birang | |
| 5,872,633 A | 2/1999 | Holzapfel et al. | |
| 5,888,119 A | 3/1999 | Christianson et al. | |
| 5,893,796 A | 4/1999 | Birang et al. | |
| 5,949,927 A | 9/1999 | Tang | |
| 5,961,372 A | 10/1999 | Shendon | |
| 5,964,643 A | 10/1999 | Birang et al. | |
| 6,045,439 A | 4/2000 | Birang et al. | |
| 6,146,248 A | 11/2000 | Jairath et al. | |
| 6,171,181 B1 | 1/2001 | Roberts et al. | |
| 6,179,709 B1 * | 1/2001 | Redeker et al. | 451/6 |
| 6,183,354 B1 | 2/2001 | Zuniga et al. | |
| 6,244,935 B1 | 6/2001 | Birang et al. | |
| 6,254,459 B1 | 7/2001 | Bajaj et al. | |
| 6,280,289 B1 | 8/2001 | Wiswesser et al. | |
| 6,280,290 B1 | 8/2001 | Birang et al. | |
| 6,358,130 B1 | 3/2002 | Freeman et al. | |
| 6,524,164 B1 | 2/2003 | Tolles | |
| 6,585,563 B1 * | 7/2003 | Redeker et al. | 451/6 |
| 6,604,985 B2 | 8/2003 | Muilenburg et al. | |
| 6,786,810 B2 | 9/2004 | Muilenburg et al. | |
| 6,796,880 B2 * | 9/2004 | Redeker et al. | 451/6 |
| 2001/0036805 A1 | 11/2001 | Birang et al. | |
| 2003/0181137 A1 | 9/2003 | Redeker et al. | |

FOREIGN PATENT DOCUMENTS

| | | |
|---|---|---|
| EP | 0 663 265 A1 | 7/1995 |
| EP | 0 738 561 A1 | 10/1996 |
| EP | 0 824 122 A1 | 2/1998 |
| EP | 0 841 122 A1 | 5/1998 |
| EP | 0 881 040 A2 | 12/1998 |
| EP | 0 881 484 A2 | 12/1998 |
| FR | 1 075 634 | 10/1954 |
| JP | 58-4353 | 1/1983 |
| JP | 62-211927 | 9/1987 |
| JP | 3-234467 | 10/1991 |
| JP | 5-309558 | 11/1993 |
| JP | 7-052032 | 2/1995 |
| JP | 7111256 | 4/1995 |
| JP | 9-036072 | 2/1997 |
| WO | WO 93/20976 A1 | 10/1993 |
| WO | WO 97/06921 A1 | 2/1997 |
| WO | WO 97/20660 A1 | 6/1997 |
| WO | WO 01/12387 A1 | 2/2001 |

* cited by examiner

LINEAR POLISHING SHEET WITH WINDOW

CROSS-REFERENCE TO RELATED CASES

This application is a continuation of U.S. patent application Ser. No. 10/394,599, U.S. Pat. No. 6,796,880 filed Mar. 21, 2003, which is a continuation of and claims priority under 35 U.S.C. § 120 to U.S. patent application Ser. No. 09/724,846, filed Nov. 28, 2000, now issued as U.S. Pat. No. 6,585,563, which is a continuation of U.S. patent application Ser. No. 09/244,816, filed Feb. 4, 1999, now issued as U.S. Pat. No. 6,179,709, the entirety of which are incorporated herein by reference.

BACKGROUND

The invention relates to linear polishing, and more particularly to in-situ monitoring of linear substrate polishing operations.

It is always desirable to monitor polishing operations in-situ. For example, during chemical mechanical polishing operations, it is desirable to determine the point (end point) when a substrate layer has been polished to a desired thickness because the polishing rate may vary over time. Chemical mechanical polishing is a process by which a substrate surface is smoothed (planarized) to a substantially uniform level by a polishing pad and an abrasive slurry. A substrate to be polished is usually mounted on a rotatable carrier head and pressed against a moving polishing pad. The polishing pad typically consists of an abrasive sheet. An abrasive chemical solution (slurry) may be introduced onto the polishing pad to assist in the polishing process.

SUMMARY

The invention features a substrate polishing scheme (apparatus and method) according to which a polishing surface of a polishing sheet is driven in a generally linear direction by a drive mechanism, a surface of a substrate is held against the polishing surface of the polishing sheet by a polishing head, and the substrate is probed through the polishing sheet by a monitoring system.

Embodiments may include one or more of the following features.

In one embodiment, the monitoring system comprises a light source configured to produce light and to direct the light through the polishing sheet to the substrate, and a detector configured to detect light reflecting from the substrate. In this embodiment, the polishing sheet includes a region that is at least semi-transparent with respect to the light produced by the light source. The polishing sheet may be formed from material that is at least semi-transparent with respect to the light produced by the light source. Alternatively, the polishing sheet may formed from material that is substantially opaque with respect to the light produced by the light source, and the polishing sheet may include a discrete region that is at least semi-transparent with respect to the light produced by the light source. The discrete region may extend substantially the length of the polishing sheet, or may extend only a limited length of the polishing sheet.

In another embodiment, the polishing surface of the polishing sheet comprises a plurality of projecting surface features. The surface features may be disposed across the polishing surface with a substantially uniform spacing between adjacent surface features, and the surface features may be sufficiently transmissive for the monitoring system to probe the substrate. Alternatively, the surface features may be disposed across the polishing surface with a substantially uniform spacing between adjacent surface features, except for a probe region of the polishing surface where the spacing between adjacent surface features is greater than the spacing at other locations to enable the monitoring system to probe the substrate.

The monitoring system may be configured to operate in coordination with the polishing head and the drive mechanism to periodically probe the substrate. A rotation mechanism may be provided to rotate the linear drive mechanism in a plane relative to the substrate.

Other features and advantages will become apparent from the following description, including the drawings and the claims.

DETAILED DESCRIPTION

Figure 1A:
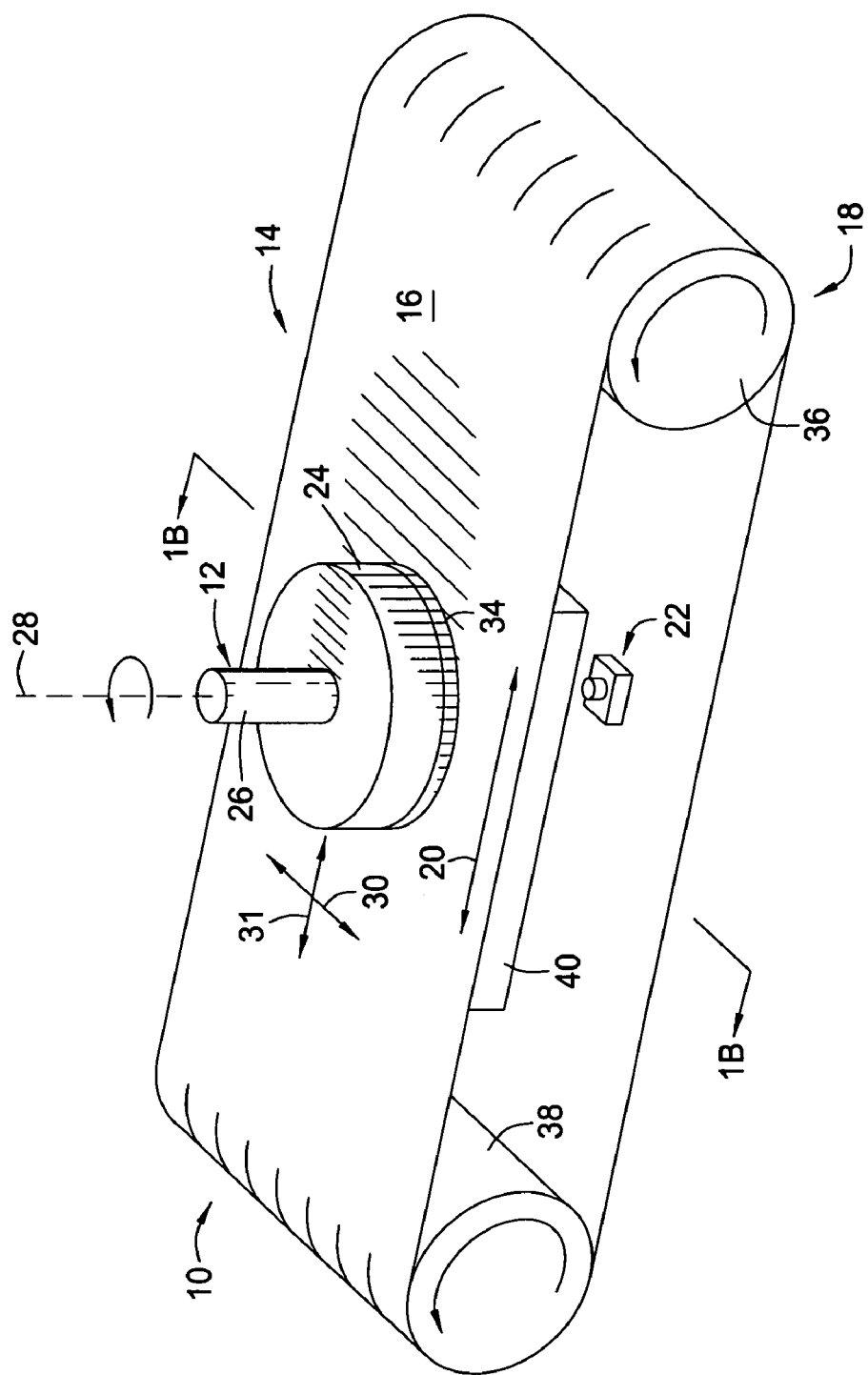
FIGS. 1A and 1B are a diagrammatic perspective view and a diagrammatic cross-sectional side view, respectively, of a linear substrate polishing apparatus that includes a system for monitoring polishing operations in-situ.
Figure 1B:
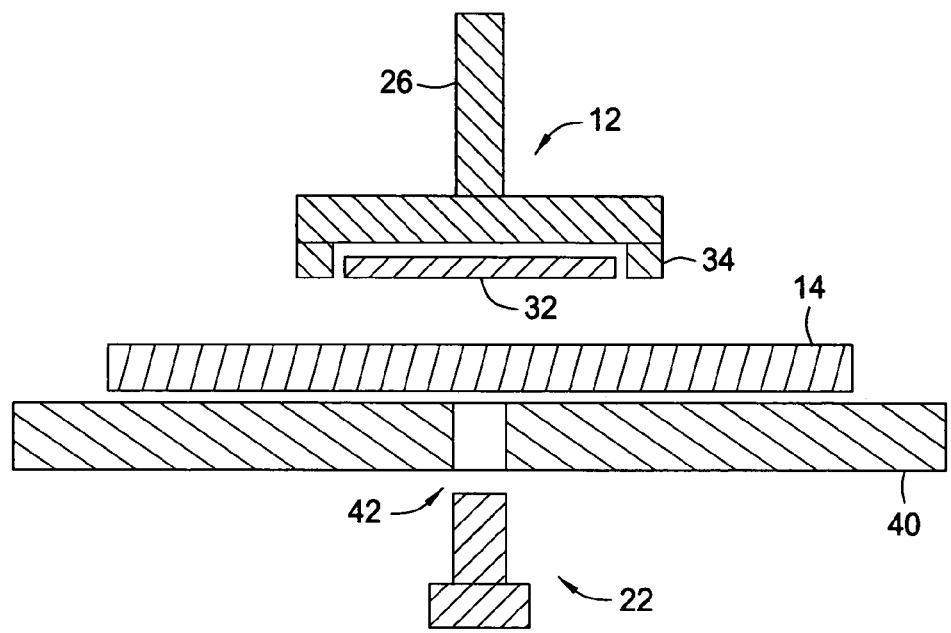

Referring to FIGS. 1A and 1B, a linear substrate polishing apparatus 10 includes a polishing head 12, a polishing sheet 14 which has a polishing surface 16, a linear drive mechanism 18 which is configured to drive polishing surface 16 in a generally linear direction 20, and a monitoring system 22.

Polishing head 12 includes a substrate support 24 coupled to a shaft 26 for rotating substrate support 24 about an axis 28. Substrate support 24 also may be translated across the surface of polishing sheet 14 along the longitudinal directions indicated by double-headed arrows 30, 31, or a combination of these directions to achieve a circular or elliptical translation path. Polishing head 12 also may be moved close to and away from polishing surface 16 by a cantilevered arm or a pneumatically-controlled support arm (not shown). Polishing head 12 includes a mechanism for retaining a substrate 32, as U.S. Pat. No. 5,961,372, which is incorporated herein by reference. In another embodiment, polishing head 12 may include a flexible sheet that provides a mounting surface for substrate 32. Pressurization of a chamber defined by the flexible sheet forces the substrate against the polishing pad. A description of a similar polishing head may be found in U.S. Pat. No. 6,183,354, which is incorporated herein by reference.

Linear drive mechanism 18 is configured to drive polishing surface 16 of polishing sheet 14 in a generally linear direction relative to substrate 32. That is, linear drive mechanism 18 is configured to move any point on polishing surface 16 in a plane that is substantially parallel to the substrate surface to be polished and along a generally straight path relative to the instantaneous position of substrate 32. In the embodiment of FIGS. 1A and 1B, linear drive mechanism 18 includes two rollers 36, 38 which engage polishing sheet 14 to drive polishing surface 16 along a linear path 20. The movement of polishing surface 16 may consist of movement in one direction, or it may consist of incremental, back-and-forth movement along path 20. Rollers 36, 38 may be oriented horizontally or vertically so long as they are configured to drive polishing surface 16 in a generally linear direction relative to the substrate surface to be polished. In one embodiment, rollers 36, 38 may be mounted on a platform configured to rotate rollers 36, 38, as a pair, so that polishing surface 16 is simultaneously rotated and driven linearly in a plane relative to substrate 32, as described in U.S. Pat. No. 6,244,935, which is incorporated herein by reference.

Polishing sheet 14 may be formed from various materials. For example, one two-layer polishing sheet includes a covering layer composed of an open-cell foamed polyurethane, or a polyurethane sheet with a grooved surface, and a backing layer composed of compressed felt fibers leached with urethane. The slurry may also include abrasive particles (e.g., silicon dioxide for oxide polishing). A polishing sheet conditioner may be provided to maintain the condition of polishing surface 16 over time.

A backing plate 40 is disposed adjacent to polishing sheet 14 at a location that is directly opposed to the location of the region over which polishing head 12 is swept across polishing surface 16. Polishing sheet 14 is sandwiched between polishing head 12 and backing plate 40. As polishing surface 16 moves along linear path 20, backing plate 40 supports the underside of polishing sheet 14 so that polishing surface 16 abrades the surface of substrate 32 with a substantially uniform pressure. Backing plate 40 defines a transparent window (or simply a hole) 42 that allows monitoring system 22 to probe substrate 32 through polishing sheet 14. Window 42 is positioned such that it has a view of substrate 32. Monitoring system 22 includes a laser which directs a probing beam of laser light (e.g., with a wavelength of about 670 nm) toward substrate 32 through window 42 and polishing sheet 14, and a detector which detects light reflecting from substrate 32. As described in detail below, polishing sheet 14 includes a region that is at least semi-transparent with respect to the light produced by monitoring system 22. Monitoring system 22 is configured to determine the amount of material removed from the surface of substrate 32, or to determine the end point of a polishing process, as described in U.S. Pat. No. 5,964,643, which is incorporated herein by reference.

Figure 2:
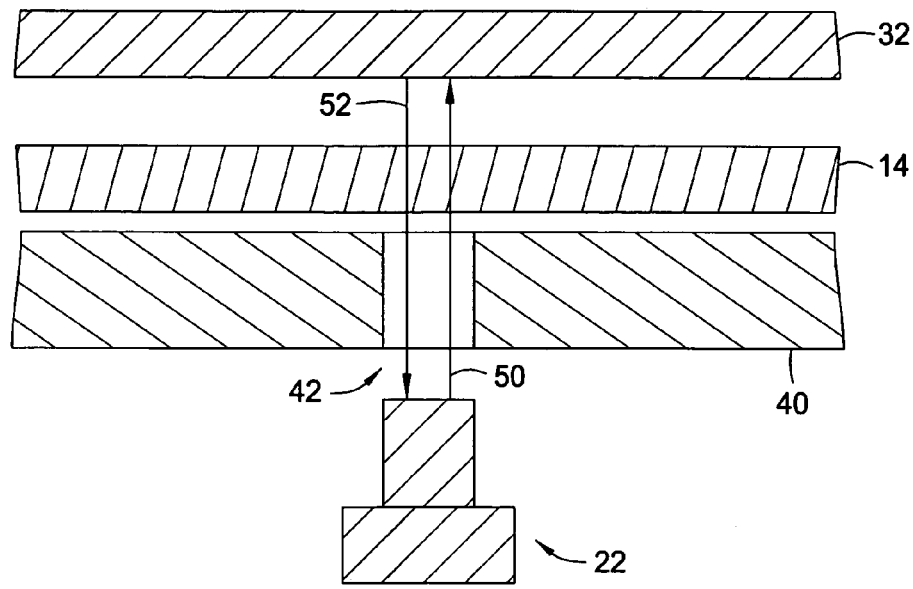
FIG. 2 is a diagrammatic cross-sectional side view of a portion of the linear substrate polishing apparatus of FIGS. 1A and 1B.

Referring to FIG. 2, in one embodiment, polishing sheet 14 is formed from a material (e.g., polyurethane) that is at least semi-transparent (substantially transmissive) with respect to the light produced by monitoring system 22. In operation, monitoring system 22 produces a laser beam 50, at least a portion of which passes through window 42 and polishing sheet 14. The portion of beam 50 which impinges on substrate 32 is partially reflected from one or more layers of substrate 32 to produce a beam 52 which has an intensity that varies as layers are removed from substrate 32. For example, if the surface layer is partially reflective and partially transmissive, beam 52 will be formed from at least two beams reflecting from different surfaces and the intensity of beam 52 will vary depending on whether the constituent beams interfere constructively or destructively, a characteristic which is primarily a function of the thickness of the surface layer. If the surface layer is substantially reflective, the intensity of beam 52 will be significantly reduced when the surface layer has been polished away. Monitoring system 22 monitors the variation in the intensity of beam 52 during a polishing process to determine the amount of material that has been removed from the surface of substrate 32, or to determine the end point of the polishing process. The operation of monitoring system 22 is coordinated with the movement of substrate support 24 to enable monitoring system 22 to periodically probe substrate 32. In particular, monitoring system 22 is configured to trigger the laser when substrate 32 is positioned over window 42; alternatively, monitoring system 22 may be configured to open a shutter over the detector when substrate 32 is positioned over Window 42.

Figure 3B:
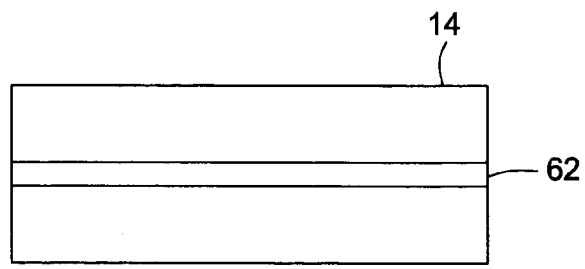
FIG. 3B is a diagrammatic top view of a linear polishing sheet with an elongated light-transmissive region that extends along the length of the polishing sheet.
Figure 3C:
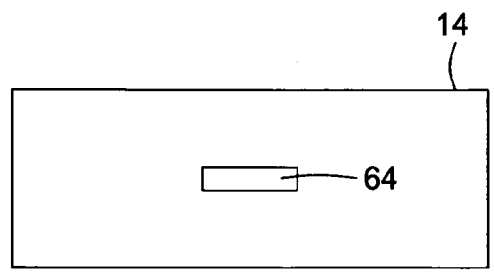
FIG. 3C is a diagrammatic top view of a linear polishing sheet with a discrete light-transmissive region.
Figure 3A:
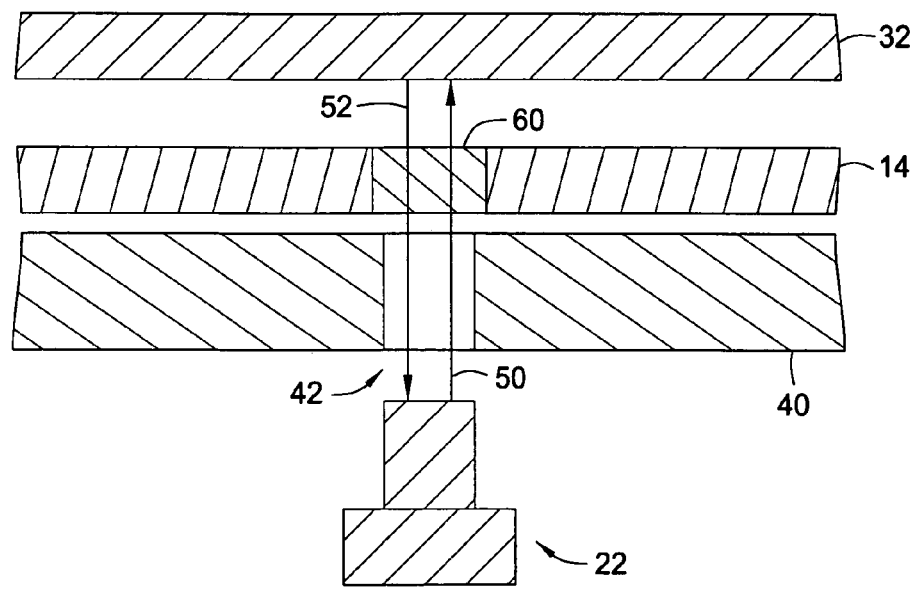
FIG. 3A is a diagrammatic cross-sectional side view of a portion of a linear substrate polishing apparatus that includes a linear polishing sheet with a light-transmissive region.

Referring to FIGS. 3A–3C, in another embodiment, polishing sheet 14 includes a discrete region 60 that is at least semi-transparent (substantially transmissive) with respect to the light produced by monitoring system 22. Discrete region 60 may have a width of about 1 cm. This embodiment may be particularly advantageous for those systems in which polishing sheet 14 is formed from a material that is substantially opaque with respect to the light produced by monitoring system 22. For example, polishing sheet 14 may be formed of polyurethane with an additive (or have an open-cell structure or a grooved surface) that inhibits the transmission of laser beam 50, and discrete region 60 may be formed from polyurethane. As shown in FIG. 3B, a discrete region 62 may extend the length of polishing sheet 14. As shown in FIG. 3C, in another embodiment, a discrete region 64 may extend over only a limited length of polishing sheet 14. In this embodiment, monitoring system 22 is configured to periodically probe substrate 32 when discrete region 64 is aligned with window 42 in backing plate 40. Additional discrete regions 64 may be provided along the length of the central portion of sheet 14, if desired.

Figure 4A:
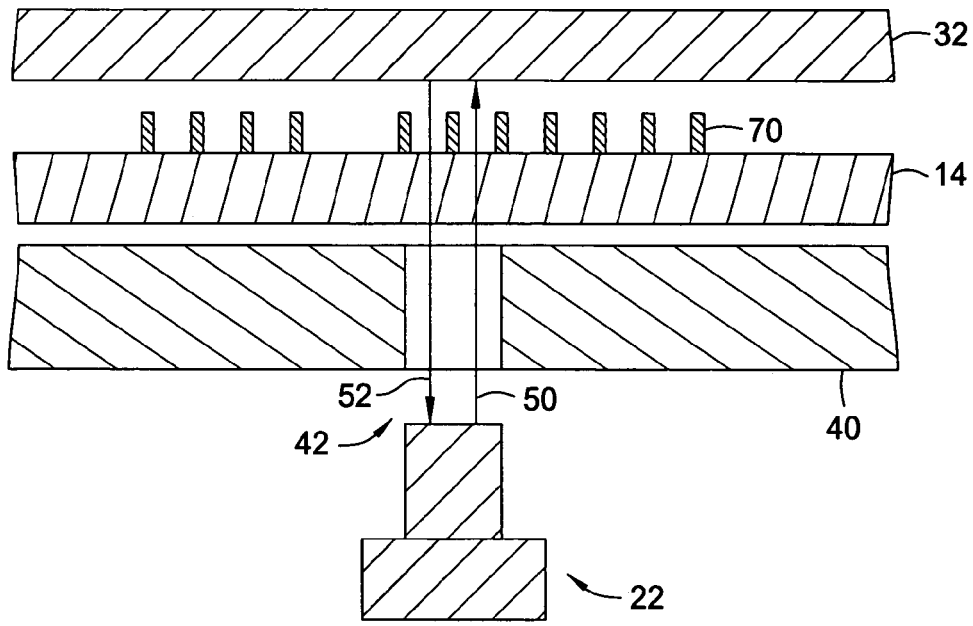
FIGS. 4A and 4B are diagrammatic cross-sectional side views of portions of linear substrate polishing apparatus that include different linear polishing sheets each having a plurality of surface polishing features.
Figure 4B:
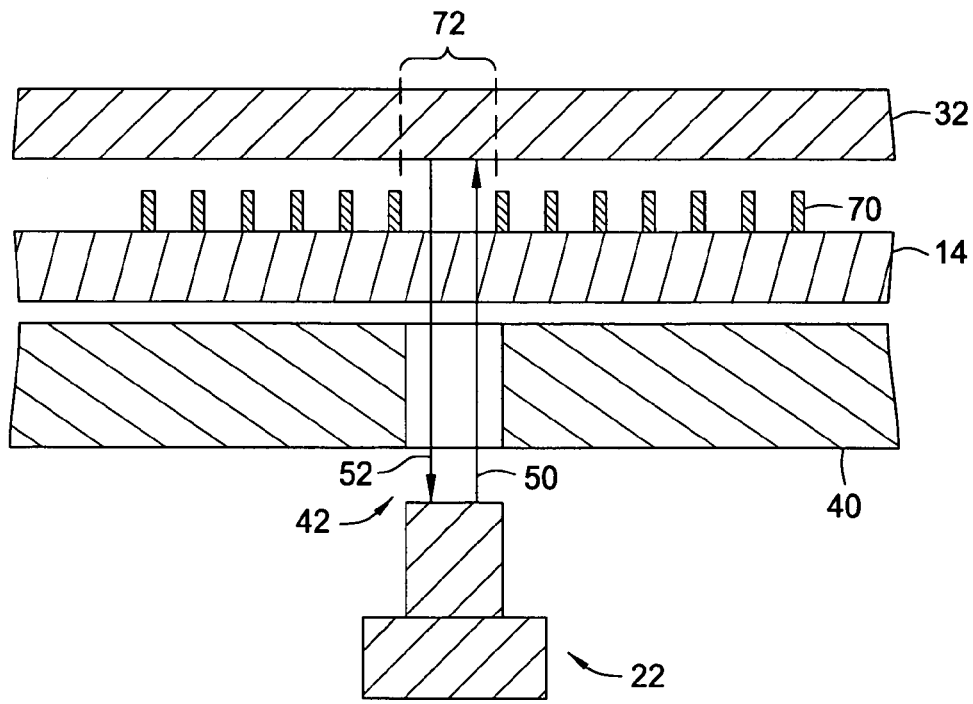

Referring to FIGS. 4A and 4B, in yet another embodiment, polishing surface 16 of polishing sheet 14 includes a plurality of projecting surface features 70 which may assist in polishing the surface of substrate 32. Surface features 70 may be arranged as a plurality of grooves or as a uniform array of protrusions. Surface features 70 may be formed from the same material as polishing sheet 14, or may be formed from a different material or include one or more additives (e.g., $CeO_2$ or alumina). As shown in FIG. 4A, surface features 70 may not significantly affect the transmission of beam 52 (e.g., the surface feature density may be sufficiently low, or the composition of surface features 70 is substantially transmissive to beams 50 and 52), enabling monitoring system 22 to probe substrate 32 without significant interference from surface features 70 (e.g., the signal to noise ratio is sufficiently high). Referring to FIG. 4B, if surface features 70 significantly affect the transmission of beams 50 and 52 (e.g., the surface feature density is too high, or the signal interference caused by each feature 70 is otherwise too great), one or more rows of surface features 70 may be removed over a region 72 to enable monitoring system 22 to probe substrate 32 without significant interference (e.g., the signal to noise ratio is sufficiently high). Region 72 may have a width of about 1 cm. In this embodiment, one or more rows of surface features 70 may be removed over the entire length of polishing sheet 14 (e.g., over a region corresponding to discrete region 62 of FIG. 3B), or only over a limited length region (e.g., over a region corresponding to discrete region 64 of FIG. 3C).

Other embodiments are within the scope of the claims. The invention may be implemented with other linear substrate polishing designs. For example, three or more rollers may be used to drive polishing sheet 14 and other additional features may be employed, as described in above-referenced U.S. Pat. No. 5,961,372. Polishing sheet 14 may be implemented in the form of a continuous belt as shown in FIG. 1A, or it may be implemented as a linear polishing sheet which is unwound from a roll of polishing material by a motor-driven take-up roller.

Still other embodiments are within the scope of the claims.

What is claimed is:

1. A method of polishing a substrate surface comprising:
   (a) contacting the substrate surface with a polishing sheet comprising one or more of $CeO_2$ and alumina, the polishing sheet comprising:
   (i) a polishing surface including a plurality of projecting surface features, wherein the projecting surface features include the one or more of $CeO_2$ and alumina, the polishing sheet comprising a material at least semi-transparent to laser light with a wavelength of about 670 nm;
   (ii) a region for monitoring reflected light, the region having no projecting surface features;
   (b) moving the polishing sheet relative to the substrate surface to polish the substrate surface; and
   (c) determining an amount of material removed from the substrate surface by:
   (i) measuring an intensity of reflected light from the substrate through the region having no projecting surface features.

2. The method according to claim 1, wherein the region having no projecting surface features does not include the one or more of $CeO_2$ and alumina.

3. The method according to claim 1, wherein the region having no projecting surface features is a discrete region that extends over an entire length of the polishing sheet.

4. The method according to claim 1, wherein the region having no projecting surface features is a discrete region that extends over a limited length of the polishing sheet.

5. The method according to claim 4, wherein the discrete region is rectangular.

6. The method according to claim 1, wherein the determining an amount of material removed comprises monitoring variations in the reflected light.

7. The method according to claim 1, wherein the polishing sheet is a continuous belt.

8. The method according to claim 1, wherein the polishing sheet is linear and unwound from a roll.

* * * * *